United States Patent
Togawa et al.

(10) Patent No.: US 10,056,524 B2
(45) Date of Patent: *Aug. 21, 2018

(54) SEMICONDUCTOR LIGHT-EMITTING ELEMENT

(71) Applicants: STANLEY ELECTRIC CO., LTD., Meguro-ku, Tokyo (JP); THE UNIVERSITY OF TOKYO, Bunkyo-ku, Tokyo (JP)

(72) Inventors: Hiroyuki Togawa, Tokyo (JP); Masakazu Sugiyama, Tokyo (JP); Mathew Manish, Tokyo (JP)

(73) Assignees: STANLEY ELECTRIC CO., LTD., Tokyo (JP); THE UNIVERSITY OF TOKYO, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 15/525,057

(22) PCT Filed: Oct. 22, 2015

(86) PCT No.: PCT/JP2015/079807
§ 371 (c)(1),
(2) Date: May 6, 2017

(87) PCT Pub. No.: WO2016/072277
PCT Pub. Date: May 12, 2016

(65) Prior Publication Data
US 2017/0317232 A1    Nov. 2, 2017

(30) Foreign Application Priority Data

Nov. 7, 2014 (JP) .................................. 2014-226919

(51) Int. Cl.
*H01L 33/06* (2010.01)
*H01L 33/32* (2010.01)
(Continued)

(52) U.S. Cl.
CPC .......... *H01L 33/06* (2013.01); *H01L 33/0025* (2013.01); *H01L 33/24* (2013.01); *H01L 33/32* (2013.01)

(58) Field of Classification Search
CPC ..... H01L 33/0025; H01L 33/04; H01L 33/06; H01L 33/08; H01L 33/32; H01L 33/20; H01L 33/22; H01L 33/24
(Continued)

(56) References Cited

U.S. PATENT DOCUMENTS

2003/0151044 A1   8/2003   Yamada
2005/0056850 A1   3/2005   Taki
(Continued)

FOREIGN PATENT DOCUMENTS

EP     2642536 A2    9/2013
JP     2004179493 A  6/2004
(Continued)

OTHER PUBLICATIONS

International Search Report (ISR) and Written Opinion dated Dec. 15, 2015 issued in International Application No. PCT/JP2015/079807.
(Continued)

*Primary Examiner* — Johannes P Mondt
(74) *Attorney, Agent, or Firm* — Holtz, Holtz & Volek PC (57) ABSTRACT

A semiconductor light-emitting element includes: a first semiconductor layer of a first conductivity type; a light-emitting functional layer including a light emitting layer formed on the first semiconductor layer; and a second semiconductor layer that is formed on the light-emitting functional layer and of a conductivity type opposite to the conductivity type of the first semiconductor layer. The light-emitting layer has: a base layer that has a composition subject to stress strain from the first semiconductor layer and (Continued)

a plurality of base segments formed in a random net shape; and a quantum well structure layer formed by embedding the base layer and composed of at least one quantum well layer and at least one barrier layer. The base layer has a plurality of sub-base layers composed of AlGaN with different Al compositions.

7 Claims, 6 Drawing Sheets

(51) Int. Cl.
  *H01L 33/00* (2010.01)
  *H01L 33/24* (2010.01)
(58) Field of Classification Search
  USPC .............................................. 257/13, 79, 103
  See application file for complete search history.

(56) References Cited

U.S. PATENT DOCUMENTS

| | | |
|---|---|---|
| 2006/0131595 A1 | 6/2006 | Chen |
| 2006/0267026 A1 | 11/2006 | Kim et al. |
| 2008/0073657 A1 | 3/2008 | Liang et al. |
| 2008/0191190 A1 | 8/2008 | Tsai et al. |
| 2009/0121214 A1 | 5/2009 | Tu et al. |
| 2009/0173955 A1 | 7/2009 | Kim et al. |
| 2010/0244042 A1 | 9/2010 | Saito et al. |
| 2010/0289043 A1* | 11/2010 | Aurelien ............... H01L 33/10 257/98 |
| 2011/0210312 A1 | 9/2011 | Tu et al. |
| 2012/0077298 A1 | 3/2012 | Liang et al. |
| 2013/0313517 A1 | 11/2013 | Choi |
| 2013/0320299 A1 | 12/2013 | Li |
| 2015/0179791 A1 | 6/2015 | Kudou |
| 2016/0043279 A1 | 2/2016 | Jean et al. |
| 2017/0317232 A1 | 11/2017 | Togawa et al. |

FOREIGN PATENT DOCUMENTS

| | | |
|---|---|---|
| JP | 2005093682 A | 4/2005 |
| JP | 2006339646 A | 12/2006 |
| JP | 2008053608 A | 3/2008 |
| JP | 2008071805 A | 3/2008 |
| JP | 2008199016 A | 8/2008 |
| JP | 2008218746 A | 9/2008 |
| JP | 2009124149 A | 6/2009 |
| JP | 2011249460 A | 12/2011 |
| JP | 4984119 B2 | 7/2012 |
| KR | 100809229 B1 | 3/2008 |
| WO | 2012059837 A1 | 5/2012 |
| WO | 2013114152 A1 | 8/2013 |

OTHER PUBLICATIONS

U.S. Appl. No. 15/561,028; First Named Inventor: Hiroyuki Togawa; Title: "Semiconductor Light-Emitting Element, and Manufacturing Method for Same"; filed Sep. 22, 2017.
Applied Physics Letters 92, 261909 (2008).
U.S. Appl. No. 15/525,054; First Named Inventor: Yusaku Fujii; Title: "Semiconductor Light-Emitting Element"; filed May 6, 2017.
U.S. Appl. No. 15/525,055; First Named Inventor: Takako Fujiwara; Title: "Semiconductor Light-Emitting Element"; filed May 6, 2017.
U.S. Appl. No. 15/525,056; First Named Inventor: Meiki Goto; Title: "Semiconductor Light-Emitting Element"; filed May 6, 2017.
Extended European Search Report (EESR) dated May 11, 2018 issued in counterpart European Application No. 15858018.3.

* cited by examiner

SEMICONDUCTOR LIGHT-EMITTING ELEMENT

TECHNICAL FIELD

The present invention relates to a semiconductor light-emitting element, such as a light-emitting diode (LED).

BACKGROUND ART

A semiconductor light-emitting element is generally manufactured by growing, on a growth substrate, a semiconductor structure layer comprised of an n-type semiconductor layer, an active layer, and a p-type semiconductor layer and forming an n-electrode and a p-electrode that apply voltage to the n-type semiconductor layer and the p-type semiconductor layer, respectively.

Patent Literature 1 discloses a white light-emitting diode in which red, green, and blue light-emitting diodes are laminated in this order so as to emit light in the same direction. Patent Literature 2 discloses a white light-emitting element including: a first light-emitting portion bonded to a conductive sub-mount substrate by a metal layer; and a second light-emitting portion formed on one region of the upper surface of the conductive sub-mount substrate. Patent Literature 3 discloses a semiconductor light-emitting element including a plurality of well layers composed of InGaN in which the In compositions of the respective well layers are different.

CITATION LIST

Patent Literature

Patent Literature 1: Japanese Patent Application Laid-Open No. 2011-249460
Patent Literature 2: Japanese Patent Application Laid-Open No. 2006-339646
Patent Literature 3: Japanese Patent Application Laid-Open No. 2004-179493

SUMMARY OF INVENTION

Technical Problem

Emission of light by a semiconductor light-emitting element is induced when binding (recombination) of an electron and a hole injected into the element through electrodes occurs in the active layer of the element. The wavelength of the light emitted from the active layer (i.e. light-emitting color) differs depending on the band gap of the semiconductor materials that make up the active layer. For example, a light-emitting element using a nitride-based semiconductor emits blue light from its active layer.

A light source is required to have color rendering properties for, for example, lighting applications. A light source with high color rendering properties is a type of light source that emits near natural light. To achieve high color rendering properties, it is preferable that light emitted from a light source have a wavelength that substantially covers the entire wavelength of the visible region. For example, light extracted from a light source with high color rendering properties is observed as white light.

In this regard, as disclosed in the aforementioned patent literatures, various techniques of using a semiconductor light-emitting element to acquire white light have been proposed. In one example technique of manufacturing a light-emitting device, a wavelength conversion member, such as a phosphor, is mixed into a sealing resin to seal the element by the sealing resin. For example, in the case of a semiconductor light-emitting element using an active layer that emits blue light, a part of blue light from the active layer is converted into yellow light by a phosphor, and the two types of light are mixed and emitted to the outside. The emitted light as a whole is thus observed as white light. In another proposed technique, by laminating a plurality of active layers with different compositions, the light emission wavelength range is widened without using a phosphor.

However, a light-emitting device manufactured using the aforementioned techniques has problems relating to the uniformity of the light-emitting wavelength within the device, the complexity of the manufacturing process, and light-emitting intensity. Possible reasons include: addition of a phosphor mixing step; change of the wavelength conversion efficiency of a phosphor over time; addition of a processing step of a semiconductor layer; and deterioration of crystallinity due to processing of a semiconductor layer.

The present invention has been made in view of the aforementioned problems. An object of the present invention is to provide a semiconductor light-emitting element that does not require a wavelength conversion member, such as a phosphor, and that has a light-emitting wavelength band (spectral width) in a wide range of the visible region and has high color rendering properties and a high light-emitting intensity.

Solution to Problem

A semiconductor light-emitting element according to the present invention includes: a first semiconductor layer of a first conductivity type; a light-emitting functional layer that is formed on the first semiconductor layer and includes a light-emitting layer; and a second semiconductor layer that is formed on the light-emitting functional layer and is of a conductivity type opposite to a conductivity type of the first semiconductor layer. The light-emitting layer has: a base layer which has a composition subject to stress strain from the first semiconductor layer and has a plurality of base segments formed in a random net shape; and a quantum well structure layer formed by embedding the base layer and composed of at least one quantum well layer and at least one barrier layer. The base layer has a plurality of sub-base layers composed of AlGaN with different Al compositions.

DESCRIPTION OF EMBODIMENTS

Embodiments of the present invention will now be described in detail hereinbelow. In this specification, an identical reference numeral is assigned to identical constituent elements.

First Embodiment

Figure 1:
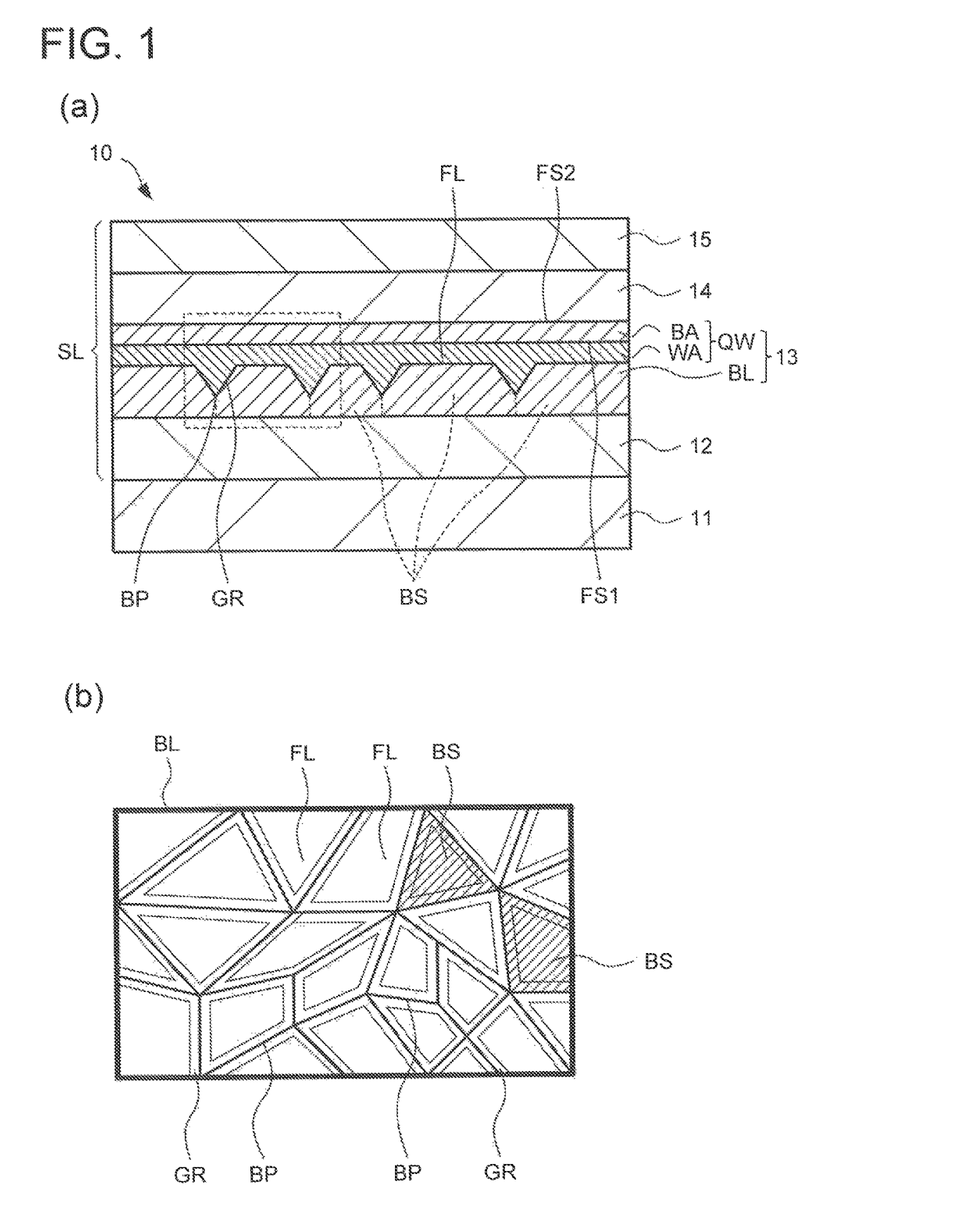
FIG. 1(a) is a cross-sectional view illustrating a structure of a semiconductor light-emitting element according to a first embodiment.
FIG. 1(b) is a schematic top plan view of a base layer of a light-emitting layer.

FIG. 1(a) is a cross-sectional view illustrating a structure of a semiconductor light-emitting element (hereinafter, simply referred to as "light-emitting element" or "element" in some cases) 10 according to a first embodiment. In the structure of the semiconductor light-emitting element 10, a semiconductor structure layer SL is formed on a mounting substrate (hereinafter, simply referred to as "substrate" in some cases) 11. The semiconductor structure layer SL includes an n-type semiconductor layer (first semiconductor layer) 12 formed on the mounting substrate 11, a light-emitting functional layer 13 formed on the n-type semiconductor layer 12, an electron blocking layer 14 formed on the light-emitting functional layer 13, and a p-type semiconductor layer (second semiconductor layer, i.e. a semiconductor layer whose conductivity type is opposite to the conductivity type of the first semiconductor layer 12) 15 formed on the electron blocking layer 14.

According to this embodiment, the mounting substrate 11 is composed of a growth substrate used for growth of, for example, the semiconductor structure layer SL, and is made of sapphire, for example. In addition, the semiconductor structure layer SL is composed of a nitride-based semiconductor. The semiconductor light-emitting element 10 can be manufactured by growing the semiconductor structure layer SL on the sapphire substrate, for example, whose c-plane serves as a crystal growth surface, using the Metal Organic Chemical Vapor Deposition (MOCVD) method. Although not illustrated in the drawings, the light-emitting element 10 has an n-electrode and a p-electrode that apply voltage to the n-type semiconductor layer 12 and the p-type semiconductor layer 15, respectively.

This embodiment is illustrated with reference to the structure of the light-emitting element 10 where the semiconductor structure layer SL is formed on a growth substrate serving as the mounting substrate 11. However, it is not limited to the structure where the mounting substrate 11 is the growth substrate. For example, the semiconductor light-emitting element 10 may have a structure obtained by first growing the semiconductor structure layer SL on a growth substrate, bonding the semiconductor structure layer SL to another substrate, and removing the growth substrate. In this case, the other substrate thus bonded is formed on the p-type semiconductor layer 15. The aforementioned pasted substrate may use materials with a high degree of heat dissipation, such as, Si, AlN, Mo, W, and CuW.

Although not illustrated in the drawings, a buffer layer (underlayer) may be provided between the mounting substrate 11 and the n-type semiconductor layer 12. The buffer layer is, for example, provided for the purpose of mitigating the strain possibly generated on the interface between the growth substrate and the semiconductor structure layer SL as well as on the interface between layers of the semiconductor structure layer SL. In this embodiment, after a GaN layer is grown on a sapphire substrate (mounting substrate 11) as a buffer layer, the n-type semiconductor layer 12 is laminated.

The n-type semiconductor layer 12 is composed of, for example, a GaN layer containing an n-type dopant (for example, Si). The electron blocking layer 14 is composed of, for example, an AlGaN layer. The p-type semiconductor layer 15 is composed of, for example, a GaN layer containing a p-type dopant (for example, Mg). The n-type semiconductor layer 12 may include a plurality of n-type semiconductor layers with different dopant concentrations. The electron blocking layer 14 may contain a p-type dopant. The p-type semiconductor layer 15 may have a contact layer on the principal surface opposite to the interface with respect to the electron blocking layer 14.

The light-emitting functional layer 13 may have a plurality of light-emitting layers. However, in this embodiment, the case where the light-emitting functional layer 13 is composed of a single light-emitting layer will be described. Therefore, in this embodiment, the light-emitting layer serving as the light-emitting functional layer 13 will be described. The light-emitting layer 13 is formed on the n-type semiconductor layer 12 and has a quantum well (QW) structure.

The light-emitting layer 13 has a base layer BL with a different composition from that of the n-type semiconductor layer 12. The base layer BL has a groove GR formed in a random net shape due to stress from the n-type semiconductor layer 12. In other words, the groove GR has a mesh shape formed by a plurality of combined groove portions created by stress strain generated in the base layer BL due to the composition difference between the n-type semiconductor layer 12 and the base layer BL. The stress strain generated in the base layer BL is strain of the crystal structure of the base layer BL caused by the lattice constant difference between the n-type semiconductor layer 12 and the base layer BL.

The light-emitting layer 13 has a quantum well structure layer QW formed on the base layer BL and composed of a quantum well layer WA and a barrier layer BA. The quantum well layer WA is formed on the base layer BL, and the barrier layer BA is formed on the quantum well layer WA. The base layer BL functions as a barrier layer for the quantum well layer WA.

A description will now be given of the base layer BL with reference to FIG. 1(b). FIG. 1(b) is a diagram schematically illustrating the upper surface of the base layer BL. The base layer BL is partitioned by the groove GR and has many fine base segments BS formed to have random sizes. Each of the base segments BS is partitioned in a random net shape since the base layer has a composition subject to stress strain from the n-type semiconductor layer 12.

The groove GR is composed of groove portions with random and different lengths and shapes. The groove GR is formed in a net (mesh) shape all over the surface of the base layer BL. Each of the base segments BS is a portion (segment) that is randomly partitioned and formed by the groove GR within the base layer BL. The upper surface of each of the base segments BS has a various shape, such as a substantially round shape, a substantially oval shape, and a polygonal shape.

The groove GR has, for example, a V-shaped cross section (FIG. 1(a)). Also, as illustrated in FIG. 1(b), the groove GR has a line-like bottom portion BP. In this embodiment, an end portion of each of the based segments BS is the bottom portion BP of the groove GR. Each of the base segments BS adjoins another base segment BS at the bottom portion BP.

Also, the base layer BL has flat portions FL corresponding to each of the base segments BS. The surface of the base layer BL is composed of the flat portions FL and the inner wall surface of the groove GR. Each of the flat portions FL is partitioned by the groove GR for each base segment BS. The base segment BS has an upper surface composed of the flat portion FL and a side surface composed of the inner wall surface of the groove GR.

In other words, the flat portions FL constitutes the upper surface of each of the base segments BS, and the inner wall surface of the groove GR constitutes the side surface of the base segment BS. Each of the base segments BS thus has an inclined side surface and has a cross section with, for example, a substantially trapezoidal shape.

The light-emitting layer 13 has a quantum well layer WA formed on the base layer BL. The quantum well layer WA is formed by embedding the groove GR. The upper surface of the quantum well layer WA is formed as a flat surface (hereinafter referred to as "first flat surface") FS1. At the interface (lower surface) with the base layer BL, the quantum well layer WA has an uneven shape corresponding to the groove GR. On the upper surface, the quantum well layer WA has a flat shape. In other words, as illustrated in FIG. 1(a), the quantum well layer WA has the first flat surface FS1 flattened by embedding the base layer BL. The quantum well layer WA is formed as a strained quantum well layer.

The light-emitting layer 13 has a barrier layer BA formed on the quantum well layer WA. Two principal surfaces of the barrier layer BA are formed as flat surfaces. Specifically, the barrier layer BA is formed on the first flat surface FS1 of the quantum well layer WA, and the upper surface is formed as a flat surface (hereinafter referred to as "second flat surface") FS2.

Figure 2:
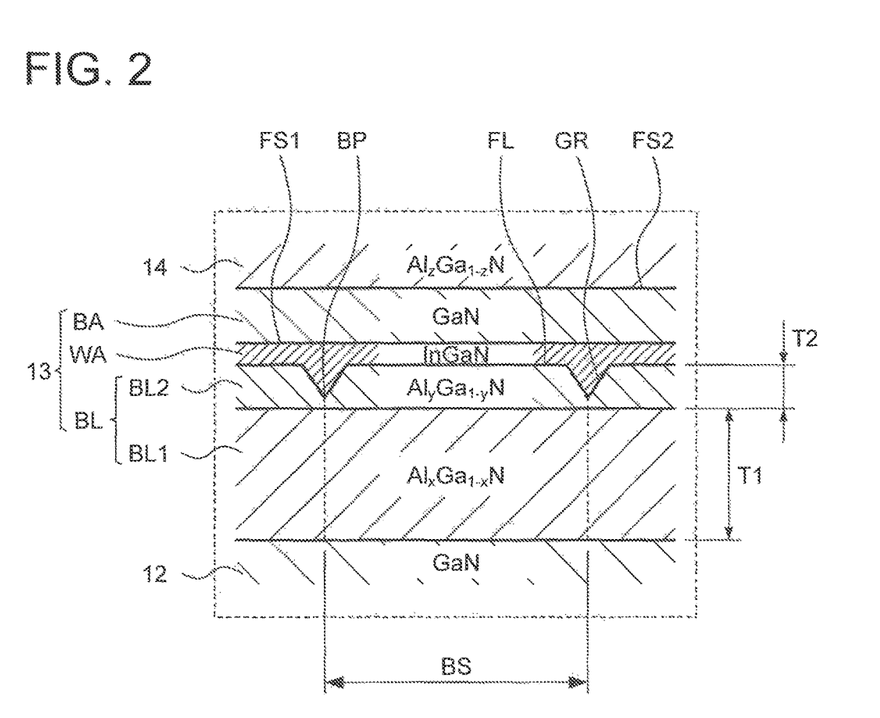
FIG. 2 is a cross-sectional view illustrating a structure of the light-emitting layer of the semiconductor light-emitting element according to the first embodiment.

FIG. 2 is a cross-sectional view illustrating the structure of the light-emitting layer 13. FIG. 2 is a partially enlarged cross-sectional view where the portion of FIG. 1(a) surrounded by the dashed line is enlarged. A description will now be given of the light-emitting layer 13 in more detail with reference to FIG. 2. The base layer BL of the light-emitting layer 13 has a first sub-base layer BL1 with a composition of $Al_xGa_{1-x}N$ ($0<x\leq1$) and a second sub-base layer BL2 with a composition of $Al_yGa_{1-y}N$ ($0<y\leq1$) that is formed on the first sub-base layer BL1. The base layer BL has a plurality of sub-base layers composed of a plurality of AlGaN layers whose Al compositions are different from each other. The quantum well layer WA has a composition of InGaN. The barrier layer BA has a composition of GaN. The electron blocking layer 14 has a composition of $Al_zGa_{1-z}N$ ($0<z\leq1$).

Of the plurality of base layers BL1 and BL2 of the base layer BL, the Al composition y of the second sub-base layer BL2 is greater than that of the first sub-base layer BL1. Specifically, the Al composition y of the second sub-base layer BL2 is greater than the Al composition x of the first sub-base layer BL1. In this embodiment, y=1 holds true in the Al composition y. In other words, in this embodiment, the first sub-base layer BL1 has a composition of AlGaN, and the second sub-base layer BL2 has a composition of AlN. The first sub-base layer BL1 has a layer thickness T1 that is greater than the layer thickness of the second sub-base layer BL2. Specifically, the layer thickness T1 of the first sub-base layer BL1 is greater than the layer thickness T2 of the second sub-base layer BL2.

A description will be hereinbelow given of the light-emitting layer 13. The base segment BS of the base layer BL can be formed by growing, at a relatively low temperature, an AlGaN layer BL1 and an AlN layer BL2, which serve as the base layer BL, on a GaN layer serving as the n-type semiconductor layer 12.

When a base layer BL different from the n-type semiconductor layer 12 in terms of crystal composition is grown on the n-type semiconductor layer 12, stress (strain) is generated in the base layer BL. For example, the base layer BL has a smaller lattice constant than that of the n-type semiconductor layer 12. For example, when an AlGaN layer serving as the first sub-base layer BL1 is formed on a GaN layer serving as the n-type semiconductor layer 12, tensile strain is generated in the AlGaN layer due to the GaN layer. Thus, tensile stress is generated in the AlGaN layer during its growth. Also, by forming an AlN layer serving as the second sub-base layer BL2 on the AlGaN layer, the tensile stress further increases. A groove is formed in the AlN layer at the beginning of or during growth of the AlN layer, and the AlN layer grows thereafter in a three-dimensional manner. In other words, the AlN layer is grown in a stereoscopic manner, and a plurality of fine protrusions and recesses are formed. The starting point of formation of this groove is the bottom portion BP of the groove GR.

When the AlN layer is grown at a low temperature, three-dimensional growth of the AlN layer is promoted. Thus, a large number of grooves are formed (the groove GR is formed) on the surface of the AlN layer while being combined with each other, whereby the surface of the AlN layer is partitioned into a plurality of granular segments. The base layer BL with the base segments BS can thus be formed. In this embodiment, the AlGaN layer and the AlN layer are formed as the base layer BL at a growth temperature of 1100° C.

When an InGaN layer serving as the quantum well layer WA is formed on this base layer BL, the quantum well layer WA is formed as a strained quantum well layer. Also, a certain distribution of the In content is generated within the quantum well layer WA. In other words, the quantum well layer WA is formed such that, for example, the region on the flat portion FL differs from the region on the groove GR in terms of In composition. Furthermore, the layer thickness of the quantum well layer WA on the upper surface of the base segment BS is different from that on the side surface of the base segment BS. Thus, the band gap is not constant within the layer of the quantum well layer WA. Thus, as the light-emitting layer 13 has fine island-shaped protrusions and recesses, the light-emitting layer 13 emits various colors of light.

To form the groove GR, the AlN layer (i.e., the second sub-base layer BL2) may be formed directly on the GaN layer. However, due to its large band gap, AlN hinders movement of a carrier (electron) from the n-type semiconductor layer (GaN layer) 12 to the quantum well layer WA. Since the AlGaN layer (first sub-base layer BL1) has an intermediate band gap relative to those of the AlN layer and the GaN layer, hindrance of carrier movement can be reduced. Thus, a decrease in the light-emitting intensity can be suppressed. By configuring the layer thickness of the base layer BL to a level where the tunnel effect of a carrier is produced, movement of an electron to the light-emitting layer 13 is promoted, and the probability of recombination with a hole increases.

As the size of the base segment BS decreases, the amount of In introduced into the quantum well layer WA increases, and the light-emitting wavelength shifts toward the long wavelength side. Specifically, when an InGaN layer serving as the quantum well layer WA is formed on the AlN layer serving as the second sub-base layer BL2, compressive strain is exerted on the InGaN layer by the AlN layer. When the InGaN layer is subject to compressive strain, In is readily introduced into the InGaN layer. Thus, by forming an InGaN layer on the second sub-base layer BL2 with a high Al composition, an InGaN layer with a high In composition can be formed. This decreases the band gap in the InGaN layer, i.e., the energy between quantum levels. The quantum well layer WA thus emits light with a light-emitting wavelength on the longer wavelength side.

In this embodiment, the light-emitting layer 13 emits light whose intensity peaks in a region on the longer wavelength side with reference to the blue region. In a specific example where the layer thickness T1 of the first sub-base layer is set to 6.6 nm, light with a broad wavelength range that has a spectral peak at approximately 530 nm is emitted.

The base layer BL has the first and second sub-base layers BL1 and BL2, whose Al compositions are different from each other. Accordingly, the light-emitting element 10 is formed so as to have a spectral width over a wide wavelength range. Since the second sub-base layer BL2 is greater than the first sub-base layer BL1 in terms of Al composition, the light-emitting layer 13 emits light with both a wide light-emitting wavelength range and a high light-emitting intensity. The light-emitting layer 13 is made to have high color rendering properties and emits light with a high light-emitting intensity.

In this embodiment, the base segment BS of the base layer BL has the flat portion FL. Accordingly, the quantum well layer WA is formed so as to embed the groove GR, and its upper surface is formed as the flat surface FS1. On the upper surface of the quantum well layer WA, a preferable level of crystallinity is thus ensured.

In this embodiment, the case where the surface of the base layer BL is composed of the flat portion FL and the groove GR was illustrated. However, the surface configuration is not limited to the aforementioned case. For example, the base layer BL may have a curved surface portion on the upper surface of the base segment BS.

Also, the present inventors examined formation of not a light-emitting layer like the light-emitting layer 13, but of a multiple quantum well structure having a plurality of quantum well layers which have one flat surface and in which the In composition is changed differently from one another. However, the range of the In composition that can be formed is limited. In the case of a light-emitting element having a light-emitting layer of a multiple quantum well structure with In compositions changed, the spectrum with a wavelength band as wide as that of the light-emitting element 10 of this embodiment was not possible. Specifically, light with a constant wavelength and a certain level of intensity in a wide range was not acquired.

Light with high color rendering properties could not be extracted by simply increasing the In composition. A quantum well layer with an excessively large In composition was formed to change the In composition in a wide range. In this case, segregation of In was noticeable, and In precipitated and blackened. Also, a portion that does not function as a light-emitting layer was formed. Thus, it can be said that there is a limit in the effort to simultaneously achieve a wider light-emitting spectrum and a higher light-emitting intensity based on the In composition.

In another example examination, the present inventors manufactured a light-emitting element by laminating light-emitting layers that are formed from different materials and have different band gaps. The simply laminated light-emitting layers respectively composed different materials only emitted light whose peak wavelength corresponds to the band gap, and the spectral intensity between the peaks was small. In this case, extraction of white light was difficult as colors were mixed in an unbalanced and unstable manner. Also, a step of forming light-emitting layers containing different types of materials was added, and the resulting device did not have a preferable level of crystallinity. In this embodiment, on the other hand, by forming a light-emitting functional layer 13 having a quantum well layer WA of a microstructure, light that has a light-emitting wavelength band (half-value width) in a wide range of the visible region was readily and certainly achieved.

As one example embodiment of the layer thickness of the base layer BL, the present inventors formed the light-emitting layer 13 with the following layer thicknesses: In the base layer BL, the first sub-base layer BL1 has a layer thickness of 6.6 nm, and the second sub-base layer BL2 has a layer thickness of 1 nm. The size of the base segment BS in the in-plane direction ranges from several tens nm to several μm.

In this embodiment, the case where the quantum well structure layer QW has a structure composed of one quantum well layer WA and one barrier layer BA has been illustrated. However, the quantum well structure layer QW is not limited to the case of being composed of one quantum well layer WA and one barrier layer BA. The quantum well structure layer QW may be composed of a plurality of quantum well layers WA and a plurality of barrier layers BA. In other words, the quantum well structure layer QW may be of a single quantum well (SQW) structure or a multiple quantum well (MQW) structure. In other words, the quantum well structure layer QW needs to have at least one quantum well layer WA and at least one barrier layer BA.

First Modified Example

Figure 3:
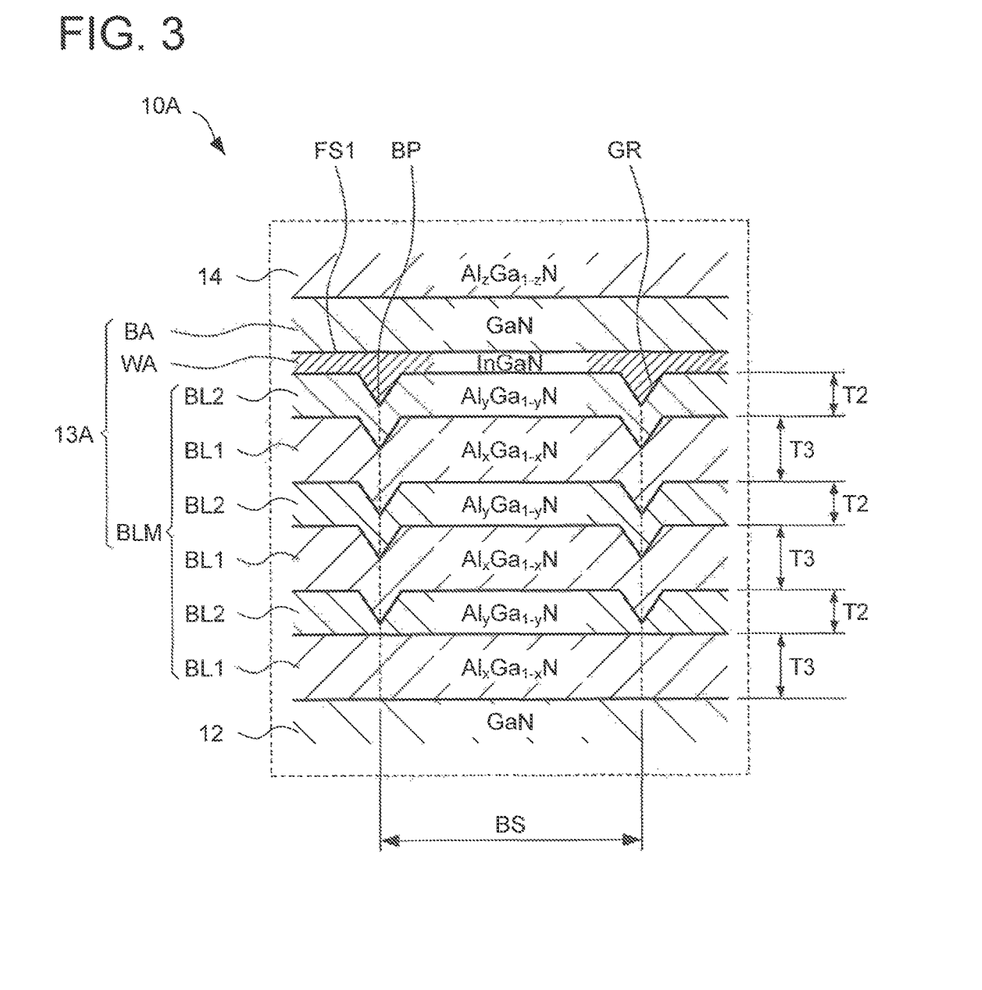
FIG. 3 is a cross-sectional view illustrating a structure of a light-emitting layer of a semiconductor light-emitting element according to a first modified example of the first embodiment.

FIG. 3 is a cross-sectional view illustrating a structure of a semiconductor light-emitting element 10A according to a first modified example of the first embodiment. Except for the structure of a base layer BLM of a light-emitting functional layer (light-emitting layer) 13A, the configuration of the light-emitting element 10A is the same as that of the light-emitting element 10. In the structure of the base layer BLM of the light-emitting layer 13A, the first and second sub-base layers BL1 and BL2 in this order are repeatedly laminated three times.

In this modified example, each of the first sub-base layers BL1 has the same layer thickness T3. For example, the layer thickness T3 of each of the first base layers BL1 is 1.5 nm or 2.2 nm. Each of the second sub-base layers BL2 has the same identical layer thickness T2. For example, the layer thickness T2 of each of the second sub-base layer BL2 is 1 nm.

When the layer thickness T3 of the first sub-base layer BL1 was set to 1.5 nm, the spectral intensity peak was approximately 520 nm. When the layer thickness T3 of the first sub-base layer BL1 was set to 2.2 nm, the spectral strength peak was approximately 535 nm. Light with a broad wavelength band was extracted under the aforementioned conditions.

In this modified example, a groove is not formed in the first sub-base layer BL1 that is located closest to the n-type semiconductor layer 12 in the base layer BLM. A groove is formed in the second sub-base layer BL2, which lies above the first sub-base layer BL1. As in the case of the base layer BL according to the first embodiment, the base layer BLM has a groove GR in its surface. In other words, in this modified example, an internal groove is formed at locations of all sub-base layers corresponding to the groove GR, except for the first sub-base layer BL1 that is located closest to the n-type semiconductor layer 12 among the first and second sub-base layers BL1 and BL2.

In this embodiment, each of the first and second sub-base layers BL1 and BL2 of the base layer BLM has a layer thickness of several nm, specifically, a thickness that produces the tunnel effect of a carrier. Thus, reduction of the recombination probability of a carrier is suppressed and a decrease in the light-emitting intensity is mitigated. The groove size and depth can be adjusted by adjusting the composition and layer thickness of each sub-base layer. Accordingly, the structure of the base layer BLM can be controlled at a high level of freedom. To broaden the light-emitting wavelength range, it is preferable that the groove GR be formed in the surface (upper surface) of the base layer BLM and that the base layer BLM be partitioned into the base segments BS.

In this modified example, the case where the base layer BLM is formed by repeatedly laminating the first and second sub-base layers BL1 and BL2 three times has been illustrated. However, the number of times of repeated lamination of the first and second sub-base layers BL1 and BL2 is not limited to the aforementioned case. The base layer BLM needs to have a structure obtained by repeatedly laminating the first and second sub-base layers BL1 and BL2 in this order a plurality of times.

Second Modified Example

Figure 4:
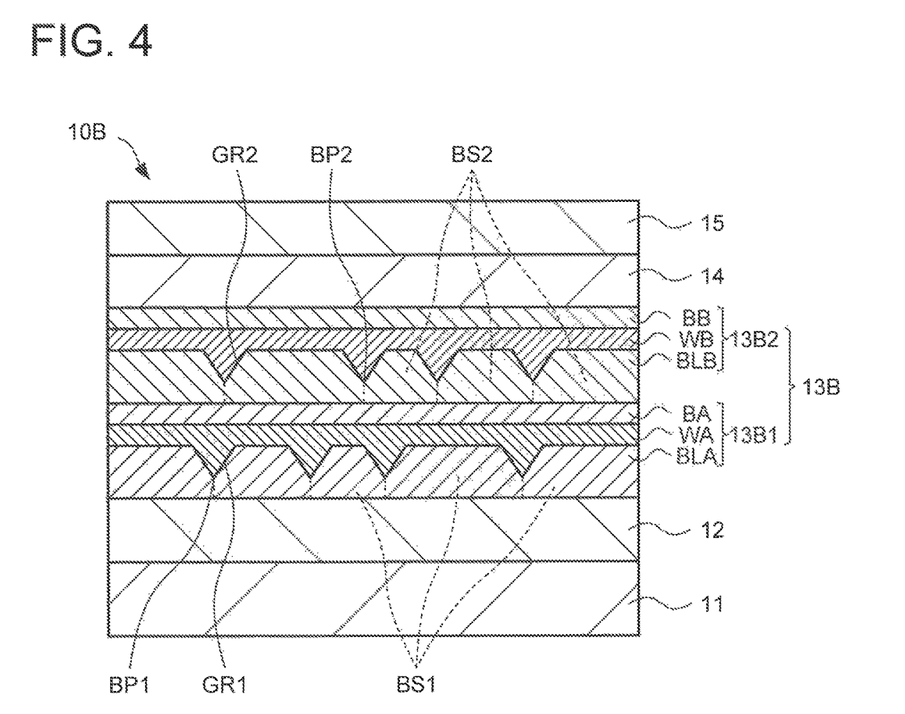
FIG. 4 is a cross-sectional view illustrating a structure of a semiconductor light-emitting element according to a second modified example of the first embodiment.

FIG. 4 is a cross-sectional view illustrating a structure of a semiconductor light-emitting element 10B according to a second modified example of the first embodiment. Except for the configuration of a light-emitting functional layer 13B, the configuration of the light-emitting element 10B is the same as that of the light-emitting element 10. The light-emitting functional layer 13B has a structure obtained by laminating a plurality of light-emitting layers 13 of the first embodiment (two in this modified example). More specifically, the light-emitting functional layer 13B has a base layer BLA, a quantum well layer WA, and a barrier layer BA and is structured such that a base layer BLB, a quantum well layer WB, and a barrier layer BB are layered on the barrier layer BA.

In the structure of the light-emitting functional layer 13B, the first and second light-emitting layers 13B1 and 13B2, whose structures are the same as that of the light-emitting layer 13, are laminated. The base layer BLA of the first light-emitting layer 13B1 and the base layer BLB of the second light-emitting layer 13B2 have grooves GR1 and GR2 which are formed to be unrelated to each other. Respective bottom portions BP1 and BP2 of the grooves GR1 and GR2 are formed at locations that are unrelated to each other. The base layers BLA and BLB have base segments BS1 and BS2, respectively, which are formed to be unrelated to each other.

The shape and size (particle diameter) of the base segment BS of each of the first and second light-emitting layers 13B1 and 13B2 are adjusted, whereby wavelength peaks of light emitted from the first light-emitting layer 13B1 and light emitted from the second light-emitting layer 13B are different from each other. The number of light-emitting wavelength peaks thus increases compared with the light-emitting element 10 of the first embodiment that has the light-emitting layer 13. Accordingly, light can be emitted over a wide wavelength range in a more stable manner.

Second Embodiment

Figure 5:
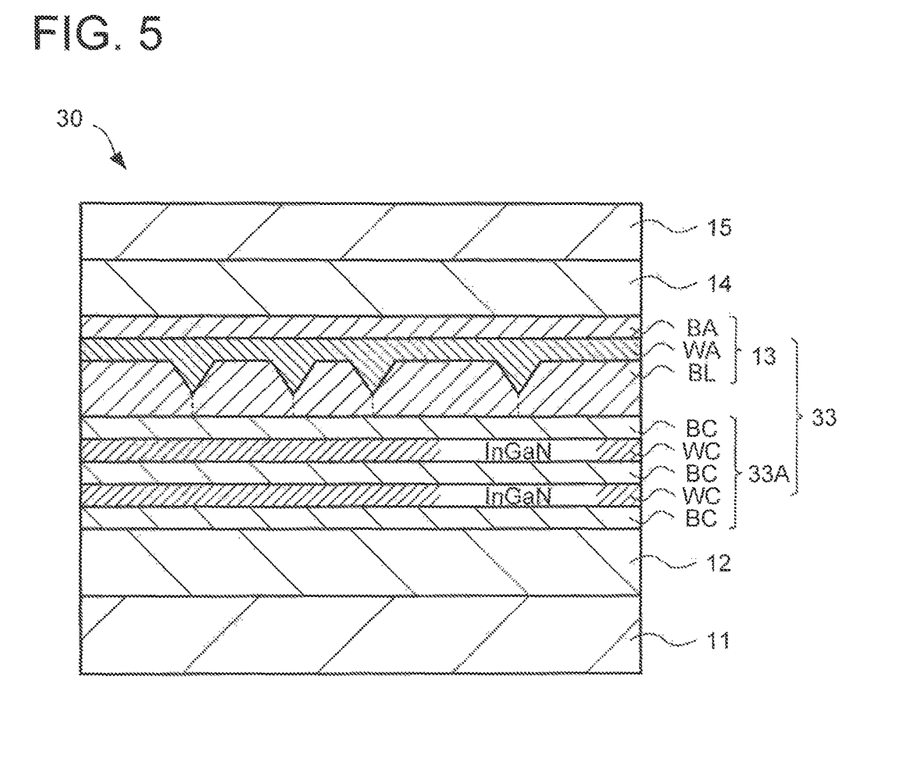
FIG. 5 is a cross-sectional view illustrating a structure of a semiconductor light-emitting element according to a second embodiment

FIG. 5 is a cross-sectional view illustrating a structure of a semiconductor light-emitting element 30 according to a second embodiment. Except for the configuration of a light-emitting functional layer 33, the configuration of the light-emitting element 30 is the same as that of the light-emitting element 10. The light-emitting functional layer 33 has a light-emitting layer (third light-emitting layer) 33A between the n-type semiconductor layer 12 and the light-emitting layer 13 of the light-emitting element 10. The third light-emitting layer 33A has a quantum well structure composed of at least one uniformly flat quantum well layer WC and a plurality of barrier layers BC such that the quantum well layer WC and the barrier layer BC are alternately laminated.

In this embodiment, the third light-emitting layer 33A has a multiple quantum well (MQW) structure where each of two quantum well layers WC is held between each of three barrier layers BC on the n-type semiconductor layer 13. The light-emitting layer 13 (base layer BL) is formed on the barrier layer BC located closest to the p-type semiconductor layer 15. Each of the quantum well layers WC has the same composition as, for example, the composition of one of the quantum well layers WA and WB, e.g., a composition of InGaN. Each of the barrier layers BC has the same composition as those of the barrier layers BA and BB, e.g., a composition of GaN. The barrier layer BC located closest to the light-emitting layer 13 of the barrier layers BC has the same composition as that of the n-type semiconductor layer 12.

In the configuration of this embodiment, the third light-emitting layer 33A of a quantum well structure is added to the side of the n-type semiconductor layer 12 of the light-emitting layer 13 of the light-emitting element 10 of the first embodiment. Compared with the first embodiment, additional light with a light-emitting wavelength peak in a pure blue region can be emitted. The configuration according to this embodiment is advantageous for, e.g., increasing the light intensity in the blue region.

Figure 6:
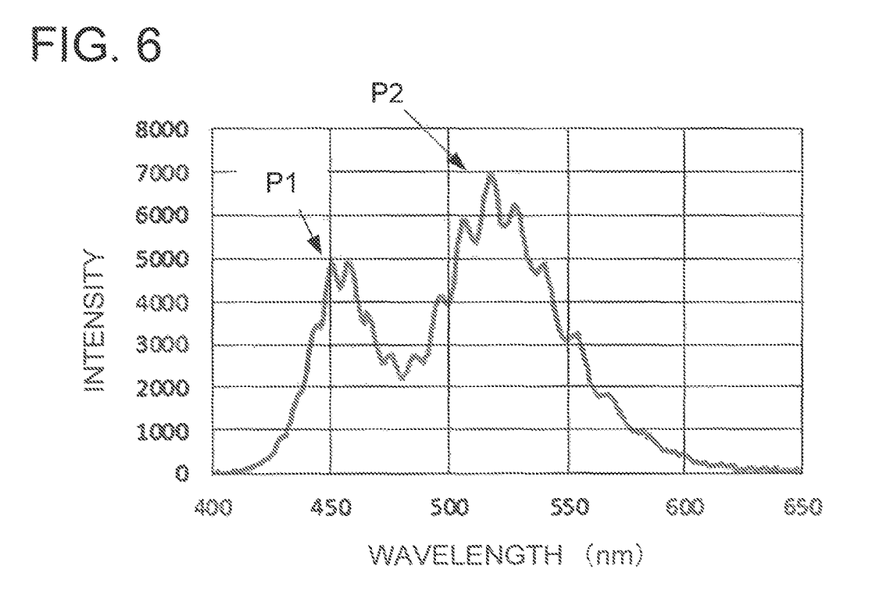
FIG. 6 is a diagram illustrating an emission spectrum from the semiconductor light-emitting element according to the second embodiment.

FIG. 6 illustrates the spectral characteristics of light emitted from the light-emitting element 30. In the drawing, the horizontal axis represents the wavelength, and the vertical axis represents the light-emitting intensity. As illustrated in FIG. 6, the light emitted from the light-emitting element 30 has two peaks and has a wide spectral width substantially in the entire visible region. Of the two peaks, a peak P1 at approximately 450 nm, which is located closest to the short wavelength side, results from the light emitted from the light-emitting layer 33A. Likewise, a peak P2 at approximately 520 nm is produced by the light emitted from the light-emitting layer 13. It was confirmed that when the light-emitting layer 33A was not provided, i.e., when the light-emitting element 10 was used, a spectral characteristic identical to that of the light-emitting element 30 was achieved except for absence of the peak P1.

The case of forming the electron blocking layer 14 between the light-emitting functional layer (light emitting layer) 13, 13A, 13B, and 33 and the p-type semiconductor layer 15 has been illustrated in these embodiments. However, these embodiments are not limited to the case of providing the electron blocking layer 14. For example, the p-type semiconductor layer 15 may be formed on the light-emitting functional layer 13. Also, the electron blocking layer 14 has a larger band gap than those of the n-type semiconductor layer 12, the light-emitting functional layer 13, and the p-type semiconductor layer 15. Accordingly, an electron can be prevented from overflowing to the side of the p-type semiconductor layer 15 through the light-emitting functional layer 13. Therefore, it is preferable to dispose the electron blocking layer 14 for large-current driving and high-temperature operation.

The first and second embodiments and the first and second modified examples can be combined with each other. For example, a light-emitting functional layer composed of the light-emitting layer 13B and the light-emitting layer 33A can be formed. Also, the light-emitting layers 13 and 13A can be laminated.

According to the embodiments and modified examples, the light-emitting layer 13 has the base layer BL which has a composition subject to stress strain from the n-type semiconductor layer 12 and has the plurality of base segments BS formed in a random net shape, and a quantum well structure layer that is formed by embedding the base layer BL and has at least one quantum well layer WA and at least one barrier layer BA. The base layer BL has a plurality of sub-base layers BL1 and BL2 composed of an AlGaN layer, whose Al compositions are different from each other. Accordingly, it is possible to provide a light-emitting element that can emit light with a high light-emitting intensity over a wide range of the visible region.

In this embodiment, the case where the first conductivity type is an n-conductivity type and the second conductivity type is a p-conductivity type, which is opposite to the n-conductivity type. However, the first conductivity type may be a p-type, and the second conductivity type may be an n-type.

REFERENCE SIGNS LIST 10, 30 semiconductor light-emitting element
12 n-type semiconductor layer (first semiconductor layer)
13, 13A, 13B, 33 light-emitting functional layer (light-emitting layer)
13B1 first light-emitting layer
13B2 second light-emitting layer
33A third light-emitting layer
14 electron blocking layer
15 p-type semiconductor layer (second semiconductor layer)
BL, BLA, BLB base layer
BL1 first sub-base layer
BL2 second sub-base layer
BS, BS1, BS2 base segment
GR groove

The invention claimed is:

1. A semiconductor light-emitting element comprising:
a first semiconductor layer of a first conductivity type;
a light-emitting functional layer that is formed on the first semiconductor layer and includes a light-emitting layer; and
a second semiconductor layer that is formed on the light-emitting functional layer and is of a conductivity type opposite to a conductivity type of the first semiconductor layer,
wherein:
the light-emitting layer includes: a base layer which has a composition subject to strain from the first semiconductor layer and has a plurality of base segments formed in a random net shape; and a quantum well structure layer embedding the base layer in a direction vertical to the base layer and composed of at least one quantum well layer and at least one barrier layer, and
the base layer has a plurality of vertically stacked sub-based layers composed of AlGaN with different Al compositions.

2. The semiconductor light-emitting element according to claim 1, wherein:
the first semiconductor layer has a composition of GaN;
each of the at least one quantum well layer has a composition of InGaN; and
the base layer has the plurality of sub-base layers including a first sub-base layer and a second sub-base layer, wherein the second sub-base layer is formed closer to a side of the second semiconductor layer than the first sub-base layer and has a larger Al composition than an Al composition of the first sub-base layer.

3. The semiconductor light-emitting element according to claim 2, wherein the base layer has a structure where the first and second sub-base layers in this order are repeatedly laminated a plurality of times.

4. The semiconductor light-emitting element according to claim 1, wherein the base layer has a layer thickness that causes a tunnel effect of a carrier.

5. The semiconductor light-emitting element according to claim 2, wherein the second sub-base layer has a composition of AlN.

6. The semiconductor light-emitting element according to claim 1, wherein the light-emitting functional layer has a structure where a plurality of the light-emitting layers are laminated.

7. The semiconductor light-emitting element according to claim 6, wherein the light-emitting functional layer has another light-emitting layer of a quantum well structure composed of at least one quantum well layer and a plurality of barrier layers between the first semiconductor layer and the light-emitting layer located closest to the first semiconductor layer among the plurality of the light-emitting layers.

* * * * *